(12) United States Patent
Sung

(10) Patent No.: US 7,247,507 B2
(45) Date of Patent: Jul. 24, 2007

(54) METHOD FOR FORMING LOCOS LAYER IN SEMICONDUCTOR DEVICE

(75) Inventor: Woong Je Sung, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/322,750

(22) Filed: Dec. 30, 2005

(65) Prior Publication Data

US 2006/0148110 A1 Jul. 6, 2006

(30) Foreign Application Priority Data

Dec. 31, 2004 (KR) .................. 10-2004-0118290

(51) Int. Cl.
*H01L 21/00* (2006.01)
(52) U.S. Cl. .................. 438/8; 430/8; 430/259; 430/439
(58) Field of Classification Search .......... 438/8, 438/269, 439, 225, 353, 4
See application file for complete search history.

(56) References Cited

U.S. PATENT DOCUMENTS 4,908,328 A * 3/1990 Hu et al. .................. 438/269
5,369,052 A * 11/1994 Kenkare et al. ............ 438/439

OTHER PUBLICATIONS

Photolithography ( 7 pages ) from website of Answer .com.*
Lithography ; except from chapter 12 of the book by Stanley Wolf ( 3 pages ) Lattice Press ( edition 2000).*

* cited by examiner

*Primary Examiner*—Andy Huynh
*Assistant Examiner*—Thinh T Nguyen
(74) *Attorney, Agent, or Firm*—Andrew D. Fortney

(57) ABSTRACT

A method for forming a LOCOS layer in a semiconductor device includes steps of oxidizing a high voltage region of the semiconductor device to form a LOCOS layer in the high voltage region; and etching the LOCOS layer according to a pattern.

15 Claims, 3 Drawing Sheets

METHOD FOR FORMING LOCOS LAYER IN SEMICONDUCTOR DEVICE

This application claims the benefit of Korean Patent Application No. 10-2004-0118290, filed on Dec. 31, 2004, which is hereby incorporated by reference as if fully set forth herein.

BACKGROUND OF THE INVENTION

1. Field of the Invention

The present invention relates to a method for forming a LOCOS layer in a semiconductor device, and more particularly, to a method for forming a LOCOS layer in a semiconductor device, by which the LOCOS layer is etched in a high voltage region to reduce on-state resistance.

2. Discussion of the Related Art

A system with a single semiconductor chip has improved with an increase in the integration of semiconductor diodes and other devices and with design techniques that have developed as a result. The single chip system may integrate a controller, a memory, and other circuitry, which operate at relatively low voltages. To achieve greater miniaturization, however, the chip may also integrate circuitry for power source control, i.e., a single circuit having input and output terminals, but since high voltages may be applied to the input and output terminals, the chip should employ internally a high-voltage power transistor as the input/output device, rather than traditional CMOS circuitry, which operates at much lower voltages. That is, the circuitry associated with the input and output terminals of the power source and the controller should also be incorporated into the single chip to reduce system size and weight.

Accordingly, to integrate into a single chip both a high-voltage transistor and a low-voltage CMOS transistor circuit, a lateral double-diffused MOS transistor is obtained by enhancing the structure of a vertical double-diffused MOS transistor, which is a conventional discrete power transistor. The drain of a lateral double-diffused MOS transistor is arranged horizontally to generate a horizontal current flow, and a drift region disposed between the drain and channel is provided to secure a higher breakdown voltage.

FIG. 1 illustrates a contemporary local oxidation of silicon layer, which is commonly known as a LOCOS layer. Here, a gate poly 20 is stacked on the LOCOS layer 10 in a high voltage region and prevents a concentration of an electrical field at the surface of the high voltage region, thereby preventing surface breakdown. In this case, however, the length of a current transfer path from a source 30 to a drain 40 is increased, thereby increasing correspondingly the on-state resistance and possibly deteriorating current driving capability.

SUMMARY OF THE INVENTION

Accordingly, the present invention is directed to a method for forming a LOCOS layer in a semiconductor device that substantially obviates one or more problems due to limitations and disadvantages of the related art.

An object of the present invention is to provide a method for forming a LOCOS layer in a semiconductor device, by which the LOCOS layer is formed using a field plate and is etched in an active area of a high voltage region to lower on-state resistance.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages in accordance with the purpose of the invention, as embodied and broadly described herein, there is provided a method for manufacturing a semiconductor device, the method comprising oxidizing a high voltage region of the semiconductor device to form a LOCOS layer in the high voltage region; and etching the LOCOS layer according to a pattern.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

High voltages are typically applied to a double-diffused MOS (DMOS) or lateral DMOS transistor. In such devices, if the source-to-drain current path can be made shorter, the device's on-state resistance may be reduced and its current driving capability may be enhanced.

Figure 1:
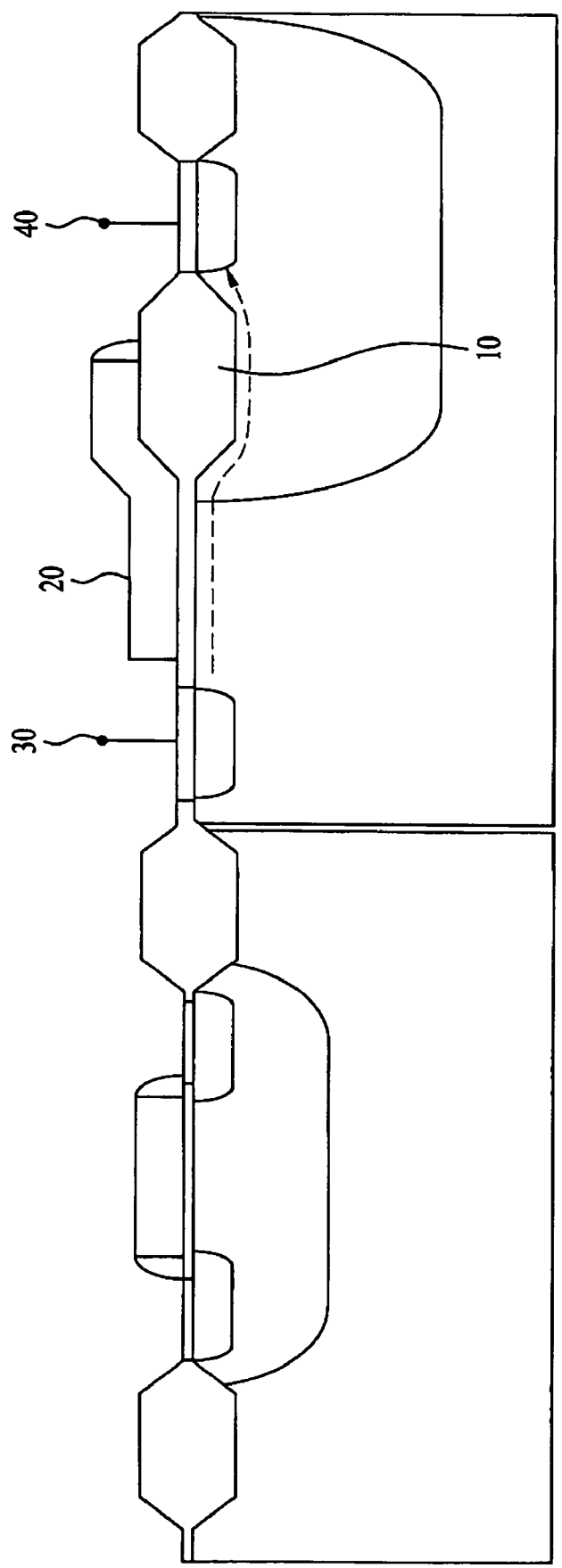
FIG. 1 is a cross-sectional view of a contemporary LOCOS layer.
Figure 2A:
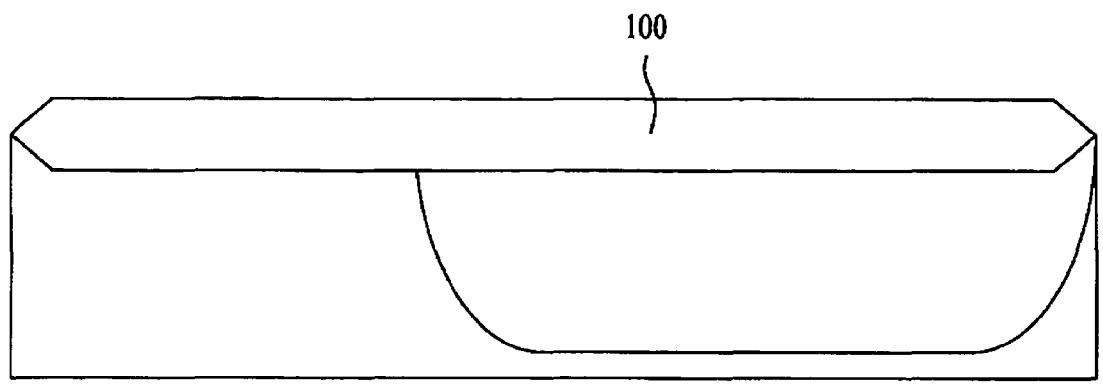
FIGS. 2A–2C are section views respectively illustrating steps of a method for forming a LOCOS layer in a semiconductor device according to the present invention.
Figure 2B:
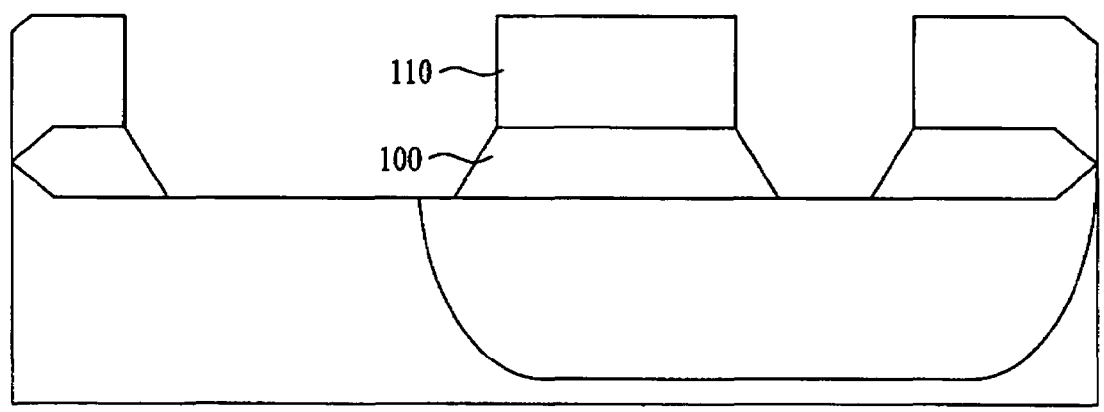
Figure 2C:
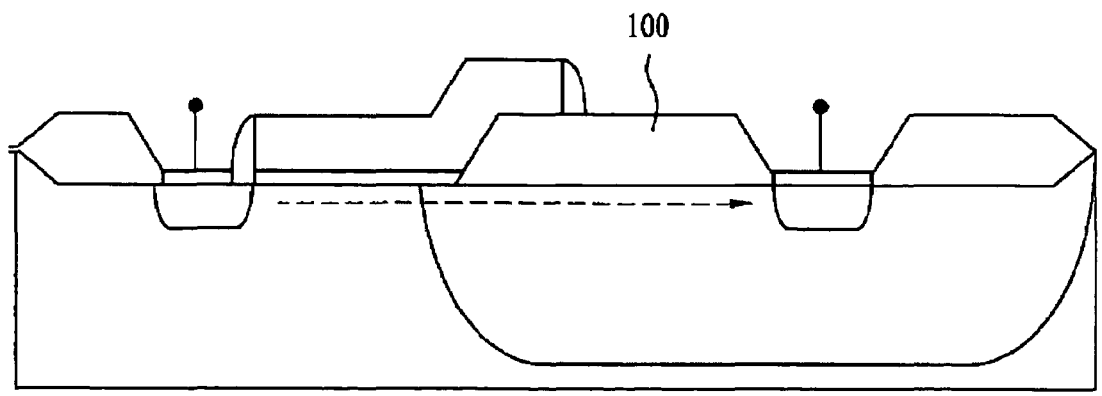

FIGS. 2A–2C respectively illustrate steps of a method for forming a LOCOS layer in a semiconductor device in accordance with the present invention.

As shown in FIG. 2A, a silicon oxide layer (e.g., a "pad oxide") is deposited or grown on a semiconductor substrate having p-type impurities therein. Then, the silicon oxide layer is coated with a first layer of photoresist, which is developed via an exposure step using a mask to form a first pattern of the photoresist, which is used to implant impurities in a surface of the semiconductor substrate to form a first ion implantation region (e.g., a deep well in the high voltage region). The first photoresist pattern is then stripped. Thereafter, the silicon oxide layer is coated with another layer of photoresist, which is developed via an exposure step using a mask to form a second pattern of the photoresist, which is used to implant impurities in a surface of the semiconductor substrate to form a second ion implantation region (e.g., a well in the CMOS device region; see, e.g., FIG. 3). The second photoresist pattern is then stripped. An annealing step is performed, and a silicon nitride layer is deposited on the annealed surface. In a manner similar to the above steps, a third photoresist pattern is formed on the silicon nitride layer, which is etched using the third photoresist pattern as a mask. In many embodiments, the exposed pad oxide layer is also etched, and optionally, the exposed semiconductor substrate may also be etched (in one example, to form a trench having sidewalls sloped at an angle of from about 75° to about 88°, and in which the trench may have a depth of from about 20 to about 45% of the target thickness of the LOCOS layer). The third photoresist pattern is then stripped. A LOCOS layer 100 is formed on the resulting structure by oxidizing the high voltage region (and more typically, oxidizing exposed silicon areas on the entire substrate, including the high voltage region and the CMOS region[s], by conventional wet or dry thermal oxidation).

As shown in FIGS. 2B and 2C, an active area of the high voltage region is coated with photoresist, which is developed via an exposure step using a mask, to form a photoresist pattern 110. The LOCOS layer 100 is etched in the high voltage region using the photoresist pattern 110 as a mask, and the mask pattern is then stripped. In one embodiment, the etched LOCOS layer 100 has a slope, e.g., of from about 60° to about 85°, or any range of values therein, to reduce adverse step coverage effects on the overlying gate electrode that may result from etched LOCOS layer 100 having a substantially perpendicular sidewall. It is well within the ability of those skilled in the art to identify and use thermal oxide etching conditions providing such a slope. Subsequent processing, conventionally performed, completes the manufacture of a semiconductor device.

Figure 3:
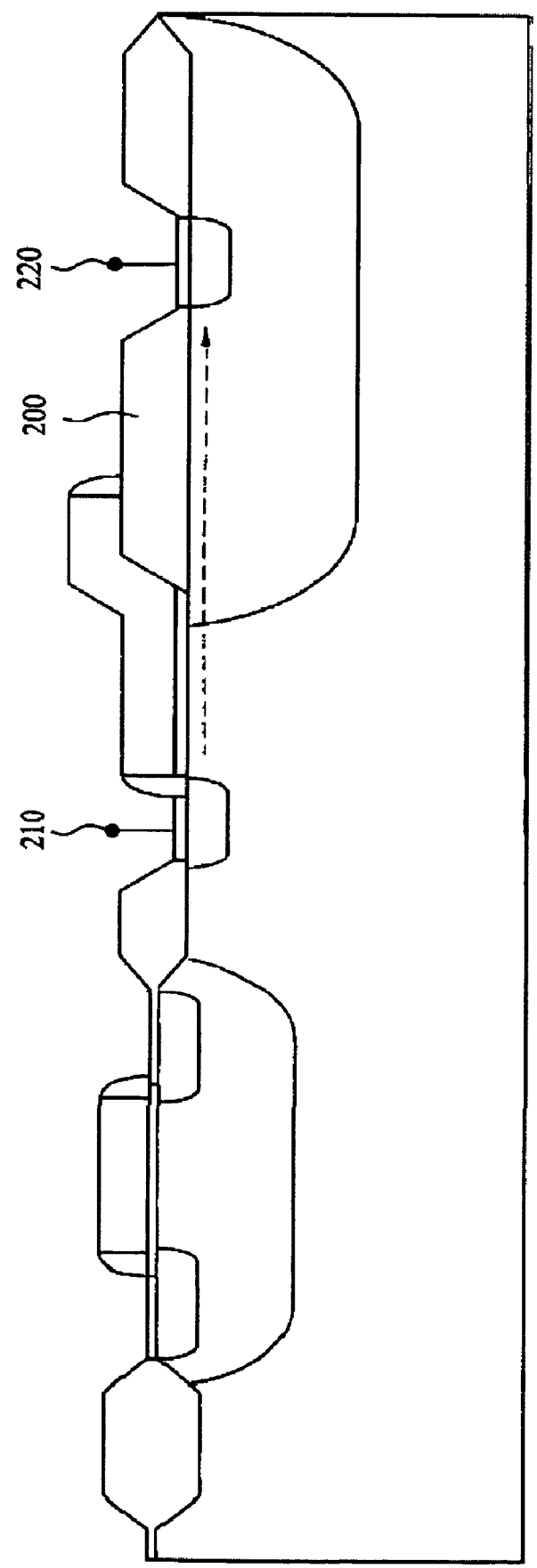
FIG. 3 is a cross-sectional view of a combined structure of a high-voltage transistor and a low-voltage transistor separated by the LOCOS layer of the present invention.

FIG. 3 illustrates a combined structure of a high-voltage transistor and a low-voltage transistor separated by the LOCOS layer of the present invention. With an etched LOCOS layer 200, a current transfer path from a source 210 to a drain 220 is substantially linear, enabling a lower on-state resistance and/or a high current capacitance. Accordingly, by adopting the method for forming a LOCOS layer in a semiconductor device as described above, a LOCOS layer may be formed using a field plate and then etched in the active area of a high voltage device region to form a linear current transfer path, thereby lowering the on-state resistance.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A method for manufacturing a semiconductor device, the method comprising:
    oxidizing a high voltage region of the semiconductor device to form a LOCOS layer on a silicon substrate in the high voltage region; and
    etching the LOCOS layer according to a pattern to expose first and second surfaces of the silicon substrate in the high voltage region;
    forming a gate electrode on the first surface and the LOCOS layer; and
    forming a source in the first surface and a drain in the second surface, thereby forming the semiconductor device having a substantially linear current transfer path from the source to the drain.

2. The method as claimed in claim 1, wherein the pattern comprises a first photoresist pattern on an active area of a high voltage device.

3. The method as claimed in claim 2, further comprising forming the first photoresist pattern on the LOCOS layer.

4. The method as claimed in claim 2, further comprising forming the photoresist pattern by coating the active area of the LOCOS layer with photoresist and developing the photoresist according to an exposure step using a mask.

5. The method as claimed in claim 4, further comprising:
    removing the photoresist pattern.

6. The method as claimed in claim 1, wherein the semiconductor device comprises a double-diffused MOS (DMOS) transistor, wherein the transistor comprises the linear current transfer path.

7. The method as claimed in claim 1, wherein the semiconductor device comprises a lateral DMOS transistor, wherein the transistor comprises the linear current transfer path.

8. The method as claimed in claim 1, further comprising forming a silicon oxide layer on the silicon substrate, the silicon substrate having p-type impurities therein, prior to oxidizing the high voltage region and forming the semiconductor device thereon.

9. The method as claimed in claim 8, further comprising forming a silicon nitride layer on the silicon oxide layer, and the silicon nitride layer functions as an oxidation mask.

10. The method as claimed in claim 1, further comprising forming a deep well in the high voltage region.

11. The method as claimed in claim 1, further comprising forming a well in a CMOS device region.

12. The method as claimed in claim 1, wherein the etched LOCOS layer has a slope of from about 60° to about 85°.

13. The method as claimed in claim 11, further comprising annealing the semiconductor device.

14. The method as claimed in claim 9, further comprising forming a second photoresist pattern on the silicon nitride layer after the annealing step, and etching the silicon nitride layer using the second photoresist pattern as a mask.

15. The method as claimed in claim 8, further comprising forming a third photoresist pattern on the silicon oxide layer, and implanting first impurities in a first region of the silicon substrate to form a drift region according to the third photoresist pattern.

* * * * *